(12) United States Patent
Yoshisato et al.

(10) Patent No.: US 6,714,420 B2
(45) Date of Patent: Mar. 30, 2004

(54) ELECTRONIC CIRCUIT UNIT THAT IS SUITABLE FOR MINIATURIZATION AND SUITABLE FOR SIMPLE OUTPUT ADJUSTMENT

(75) Inventors: Akiyuki Yoshisato, Fukushima-ken (JP); Kazuhiko Ueda, Fukushima-ken (JP); Yasuhiro Ikarashi, Fukushima-ken (JP); Akihiko Inoue, Fukushima-ken (JP); Hiroshi Sakuma, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 146 days.

(21) Appl. No.: 09/870,415

(22) Filed: May 29, 2001

(65) Prior Publication Data

US 2002/0011596 A1 Jan. 31, 2002

(30) Foreign Application Priority Data

May 30, 2000 (JP) ........................ 2000-160252
May 30, 2000 (JP) ........................ 2000-160257

(51) Int. Cl.[7] ................................. H05K 1/16
(52) U.S. Cl. ........................ 361/760; 361/765
(58) Field of Search ................ 361/760–766, 361/792–794, 780–784; 330/302, 277, 286; 257/723–724

(56) References Cited

U.S. PATENT DOCUMENTS 3,809,928 A    5/1974  Evans
3,958,075 A *  5/1976  Kaufman ................ 174/16.3
4,001,711 A *  1/1977  Knutson et al. ........... 330/66
4,318,054 A *  3/1982  Yokoyama ................ 330/302
4,841,253 A *  6/1989  Crabill .................... 330/277
5,157,582 A * 10/1992  Sugita et al. ............ 361/321.1
5,561,592 A * 10/1996  Furutani et al. ............ 361/707
5,629,563 A *  5/1997  Takiar et al. .............. 257/723
5,752,182 A *  5/1998  Nakatsuka et al. ......... 455/333
6,163,221 A * 12/2000  Matsuno .................. 330/302
6,330,165 B1 * 12/2001  Kohjiro et al. ............. 361/760
6,603,667 B2 *  8/2003  Yoshisato et al. ........... 361/782

FOREIGN PATENT DOCUMENTS

FR         2 478 402       9/1981

* cited by examiner

Primary Examiner—Evan Pert
Assistant Examiner—Tuan Dinh
(74) Attorney, Agent, or Firm—Brinks Hofer Gilson & Lione

(57) ABSTRACT

The invention provides a surface mounting type electronic circuit unit that is suitable for miniaturization and is suitable for simple output adjustment. Circuit elements including capacitors, resistors, and inductance elements and a conducting pattern connected to the circuit elements are formed on an alumina substrate by means of thin film forming technique, and a diode D1 and a semiconductor chip of a transistor are fixed to a connection land of the conducting pattern by means of wire bonding, wherein only the emitter resistor out of the base bias voltage dividing resistors and the emitter resistor of the transistor is trimmed for output adjustment.

8 Claims, 8 Drawing Sheets

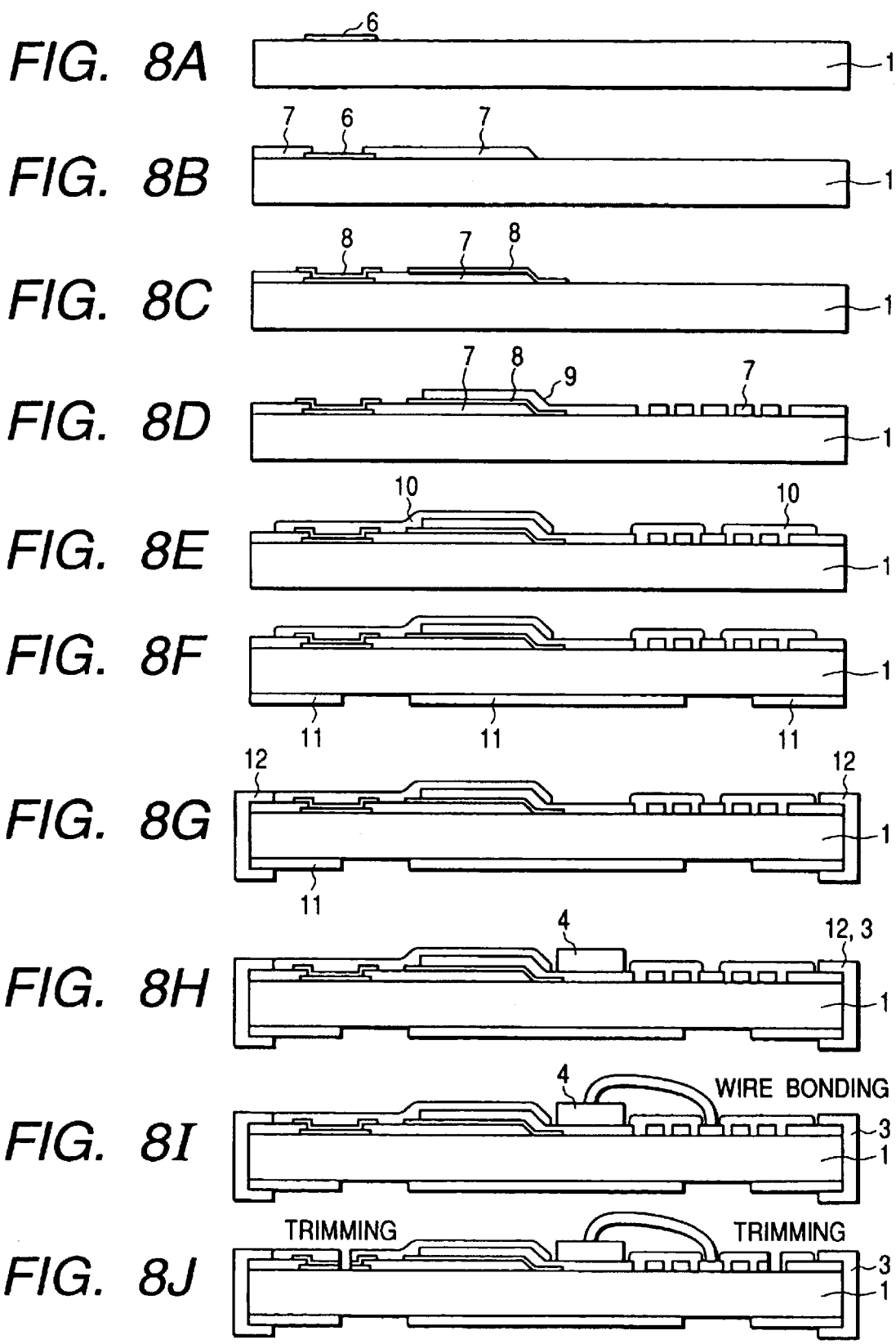

ELECTRONIC CIRCUIT UNIT THAT IS SUITABLE FOR MINIATURIZATION AND SUITABLE FOR SIMPLE OUTPUT ADJUSTMENT

BACKGROUND OF THE INVENTION

1. Field of the Invention

This invention relates to a surface mounting type electronic circuit unit.

2. Description of the Related Art

In general, a surface mounting type electronic circuit unit of this type has a structure in which various circuit parts are soldered on soldering lands of a conducting pattern formed on a substrate and these circuit parts are covered with a shield cover. The substrate has side end electrodes on the side thereof, and the side end electrodes are soldered on soldering lands of a mother substrate when the electronic circuit unit is surface-mounted on the mother substrate. The circuit parts are used depending on the required circuit structure such as a tuning circuit, resonance circuit, or amplifier circuit. For example, the transistor, chip resistance, chip capacitor, and inductor are used as the circuit parts of an amplifier circuit, and these circuit parts are connected through the conducting pattern.

Recently, the technique for miniaturizing the circuit parts such as chip parts and transistor has been progressed markedly, and for example, the ultra-small chip resistor and chip capacitor having an apparent size of approximately 0.6×0.3 mm have been used practically. Therefore, it is possible that such small-size chip parts and transistor are used for the above-mentioned convention electronic circuit unit and are mounted on a substrate with narrow pitch between circuit parts to thereby miniaturize the electronic circuit unit to a certain extent. However, the miniaturization of the circuit parts such as chip parts and transistor is limited, and narrowing of the pitch between parts is limited because many circuit parts should be mounted on a substrate so that soldered portions of individual circuit parts are prevented from short-circuiting. These limitations have prevented further miniaturization of the electronic circuit unit.

Furthermore, in the case where an electronic circuit unit of this type has, for example, an amplifier circuit, general-use chip resistors having a resistance value that has been trimmed previously to a desired value have been used as all resistors that are necessary for the amplifier circuit in the above-mentioned conventional art. However, if the mounted chip resistors have some resistance value dispersion, then the collector current of the transistor is dispersed, and the troublesome output adjustment is required.

SUMMARY OF THE INVENTION

The present invention has been accomplished in view of the problem of the conventional art, and it is the object of the present invention to provide an electronic circuit unit that is suitable for miniaturization and is suitable for simple output adjustment.

To achieve the above-mentioned object, an electronic circuit unit of the present invention comprises circuit elements including capacitors, resistors, and inductance elements formed on an alumina substrate by means of thin film forming technique, and a semiconductor bare chip of a transistor fixed to the alumina substrate by means of wire bonding, wherein the transistor has at least a first transistor, and only the emitter resistor, out of a base bias voltage dividing resistor and an emitter resistor of the first transistor, is trimmed to set the current value of the first transistor.

According to the above-mentioned structure, because circuit elements including capacitors, resistors, and inductance elements are formed with high precision by means of thin film forming technique and a semiconductor bare chip of a transistor is fixed by means of wire bonding, necessary circuit parts are mounted in high density on an alumina substrate and a surface mounting type electronic circuit unit that is suitable for miniaturization is realized. Furthermore, even if individual base bias voltage dividing resistors formed on an alumina substrate by means of thin film forming technique have some resistance value dispersion, because the collector current value can be varied by trimming only the emitter resistor, the resistance value can be trimmed at one location for output adjustment.

Furthermore, in the case where the transistor has first transistor and second transistor connected in series, it is preferable that only the emitter resistor of the first transistor, out of the base bias voltage dividing resistors and emitter resistors of the first and second transistors, is trimmed to set the current value of both transistors. Trimming of all the base bias voltage dividing resistors can be omitted and only the emitter resistor of the first transistor may be trimmed.

Furthermore, the electronic circuit unit of the present invention has circuit elements including capacitors, resistors, and inductance elements formed on an alumina substrate by means of thin film forming technique, and a semiconductor bare chip of a transistor fixed to the alumina substrate by wire bonding, wherein the transistor has at least a first transistor, and base bias voltage dividing resistors used for applying a voltage on the base of the first transistor are formed proximate to each other on the alumina substrate by means of thin film forming technique.

According to the above-mentioned structure, because circuit elements including capacitors, resistors, and inductance elements are formed with high precision by means of thin film forming technique and a semiconductor bare chip of a transistor is fixed by means of wire bonding, necessary circuit parts are mounted in high density on an alumina substrate and a surface mounting type electronic circuit unit that is suitable for miniaturization is realized. Furthermore, though the absolute value of resistors formed on the alumina substrate by means of thin film forming technique has some dispersion, because a plurality of base bias voltage dividing resistors used to apply a voltage on the transistor are formed proximate to each other by means of thin film forming technique, the ratio of dispersion of the resistors is almost equalized, and trimming of the resistor value can be omitted.

Furthermore, in the case where the transistor has a first transistor and second transistor connected each other in series, it is preferable that base bias voltage dividing resistors of the first and second transistors are formed proximate to each other on the alumina substrate by means of thin film forming technique. Thereby, trimming of all the base bias voltage dividing resistors can be omitted.

Furthermore, in the case of the above-mentioned structure, it is preferable that a part of or all of the plurality of base bias voltage dividing resistances are located on a plurality of lines. Thereby, the base bias voltage dividing resistors are disposed efficiently on a limited space of the alumina substrate.

BRIEF DESCRIPTION OF THE DRAWINGS

FIG. 8A to FIG. 8J are explanatory views illustrating fabrication process of the electronic circuit unit.

DETAILED DESCRIPTION OF THE PREFERRED EMBODIMENTS

Figure 1:
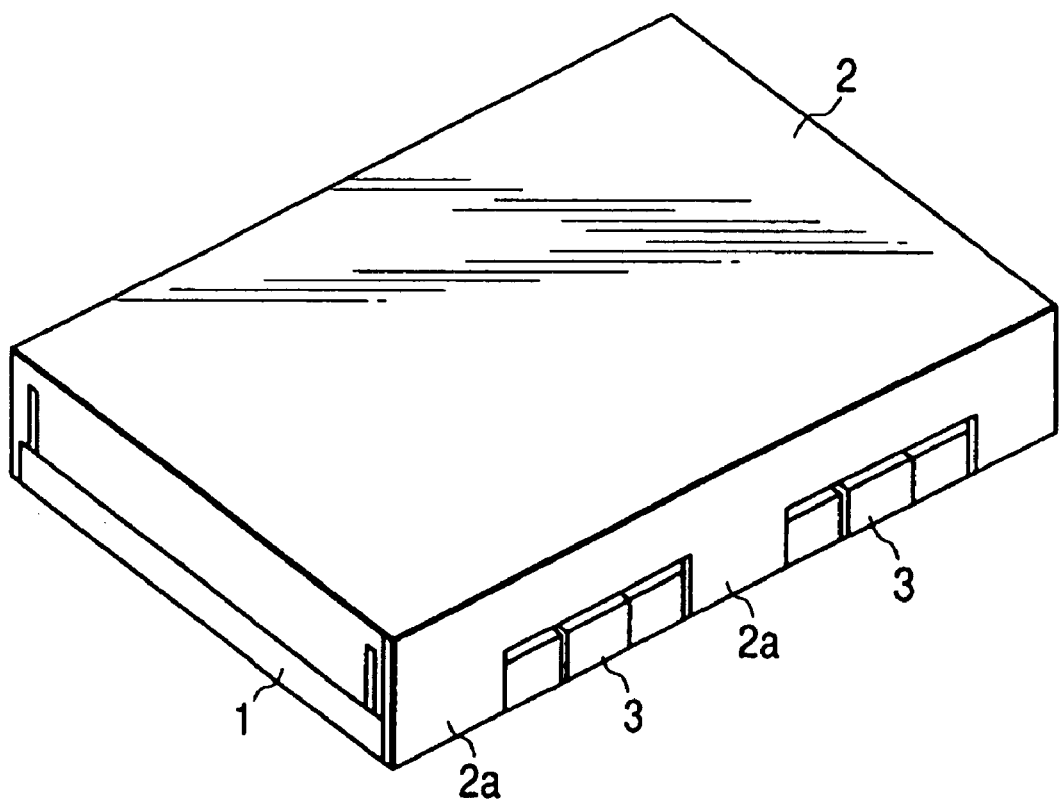
FIG. 1 is a perspective view of an electronic circuit unit in accordance with an embodiment of the present invention.
Figure 4:
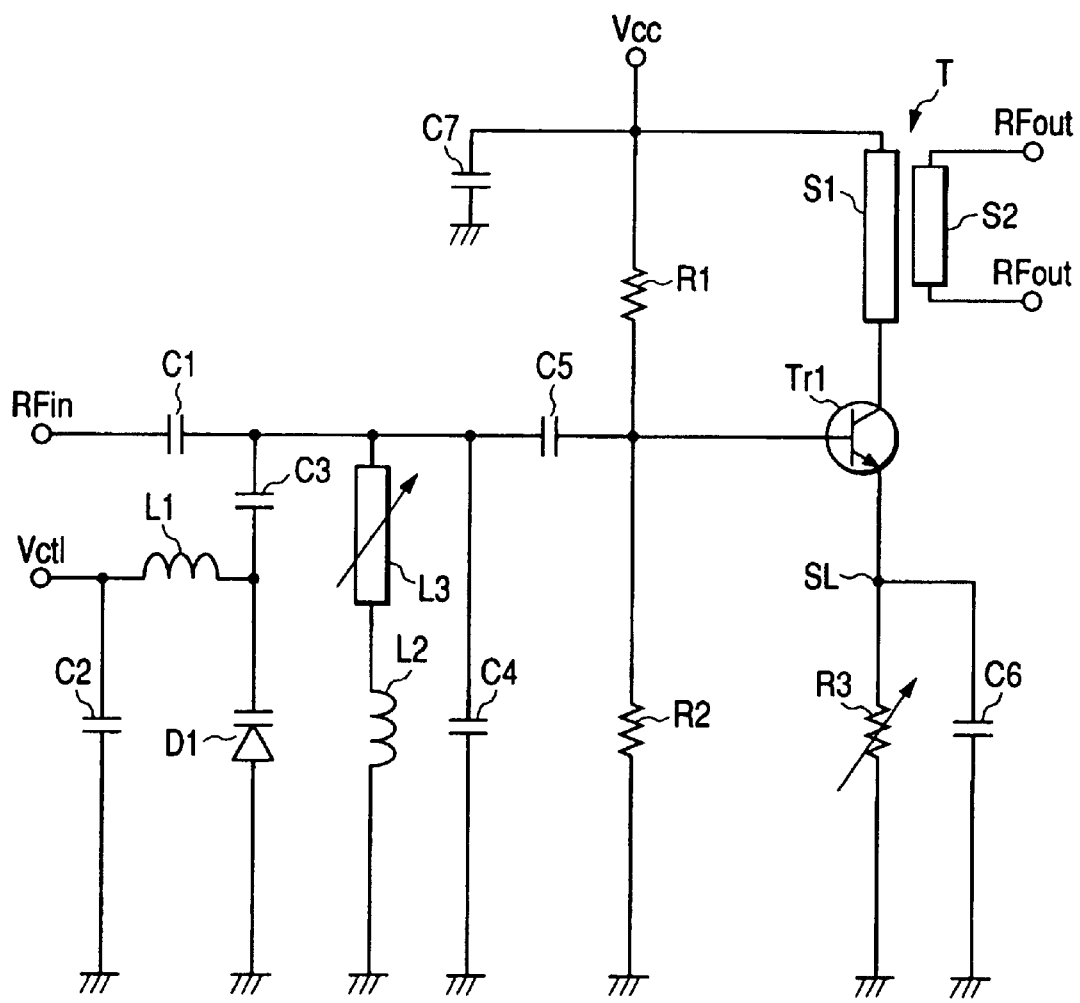
FIG. 4 is an explanatory view of the circuit structure.
Figure 5:
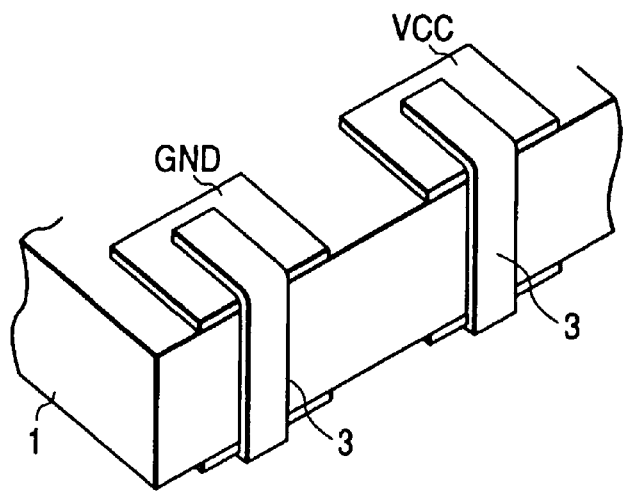
FIG. 5 is a perspective view illustrating end side electrodes.
Figure 6:
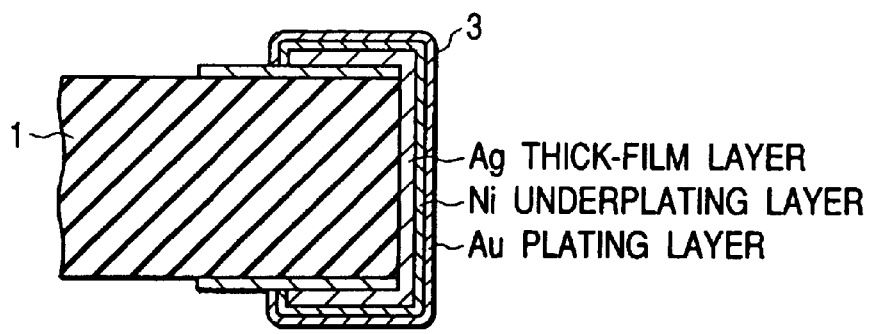
FIG. 6 is a cross sectional view of an end side electrode.
Figure 7A:
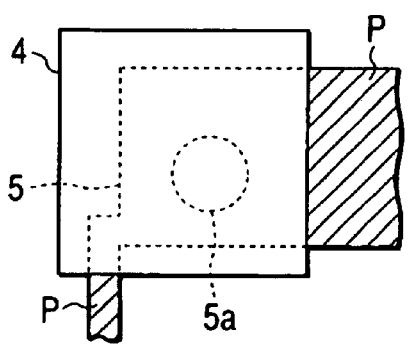
FIG. 7A and FIG. 7B are explanatory views illustrating the relation between a semiconductor bare chip and a connection land.
Figure 7B:
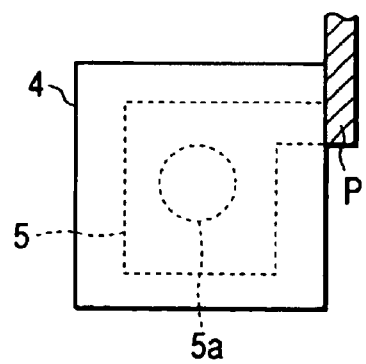

Embodiments of the present invention will be described in detail hereinafter with reference to the drawings. FIG. 1 is a perspective view of an electronic circuit unit, FIG. 2 is a plan view of an alumina substrate illustrating the circuit structure layout, FIG. 3 is a backside view of the alumina substrate, FIG. 4 is an explanatory view of the circuit structure, FIG. 5 is a perspective view illustrating end side electrodes, FIG. 6 is a cross sectional view of an end side electrode, FIG. 7A and FIG. 7B are explanatory views illustrating the relation between a semiconductor bare chip and a connection land, and FIG. 8A to FIG. 8J are explanatory views illustrating a fabrication process of an electronic circuit unit.

The present embodiment is an example in which the present invention is applied to a frequency tuning type booster amplifier, the frequency tuning type booster amplifier is used for improving the reception performance (particularly for improvement of the reception sensitivity and anti-disturbance characteristic) of a potable type television apparatus in combination with UHF tuner. Thereby, a TV signal of a desired frequency is selected, and the selected TV signal is amplified and supplied to the UHF tuner.

FIG. 1 shows an apparent configuration of such frequency tuning type booster amplifier (electronic circuit unit). As shown in FIG. 1, the frequency tuning type booster amplifier comprises an alumina substrate 1 on which circuit component elements are mounted, that will be described hereinafter, and a shield cover 2 fixed to the alumina substrate 1. The frequency tuning type booster amplifier will be used as a surface mounting parts that is to be soldered to a mother substrate not shown in the drawing. The alumina substrate 1 is configured in a rectangular flat plate, which is obtained by cutting a large substrate into divided rectangles and by dividing a divided rectangle further into small pieces. The shield cover 2 is formed by bending a metal plate into a box, and the circuit component element on the alumina substrate 1 is covered by the shield cover 2.

Figure 2:
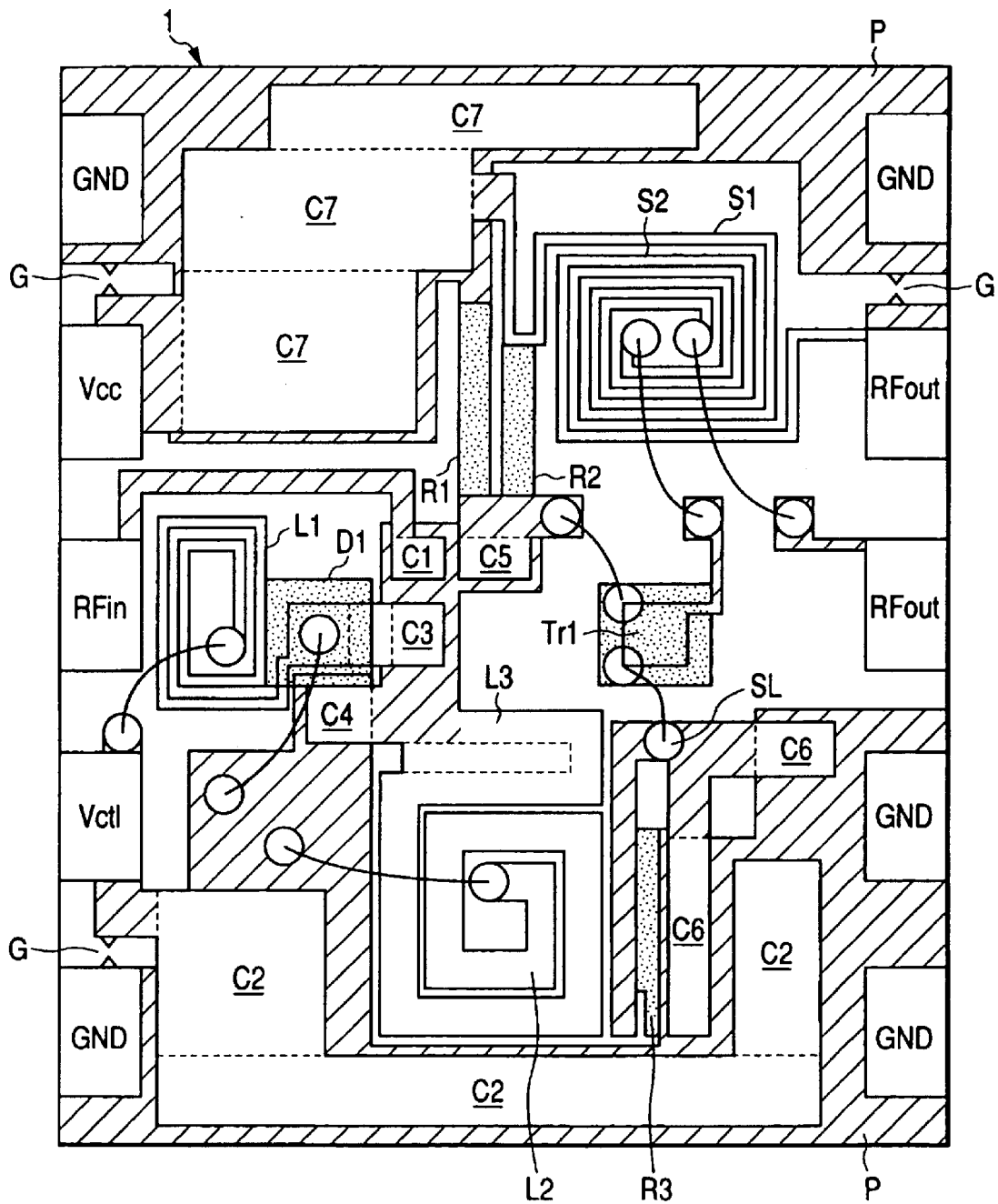
FIG. 2 is a plan view of an alumina substrate illustrating the circuit structure layout.
Figure 3:
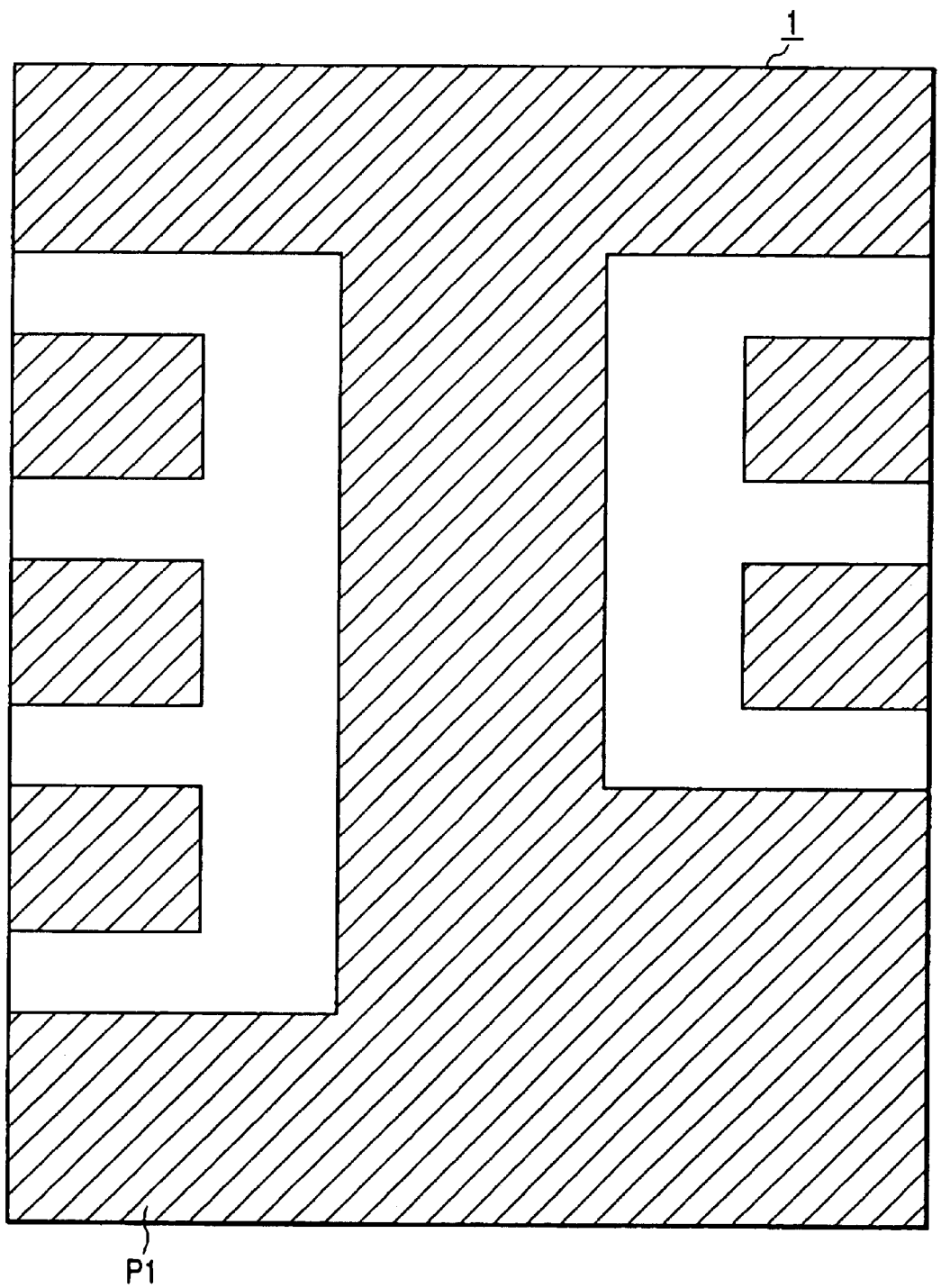
FIG. 3 is a backside view of the alumina substrate.

As shown in FIG. 2, the circuit component elements and a conducting pattern that is served to connect the circuit component elements are provided on the surface of the alumina substrate 1, and as shown in FIG. 3, a conducting pattern that is served as a backside electrode is provided on the backside of the alumina substrate 1. The frequency tuning type booster amplifier in accordance with the present embodiment having the circuit structure as shown in FIG. 4 is provided with a tuning circuit and amplifier circuit for selecting a TV signal and amplification respectively, and the same characters of the circuit diagram shown in FIG. 4 are given to the same circuit component elements shown in FIG. 2. However, FIG. 4 shows only an example of the circuit structure, and the present invention is applied to other electronic circuit units having the circuit structure different from the above-mentioned circuit structure.

As shown In FIG. 4, the frequency tuning type booster amplifier has capacitors C1 to C7, resistors R1 to R3, inductance elements L1 to L3, a diode D1, a transistor Tr1, and conducting paths S1 and S2 that are served as the circuit component element of the tuning circuit and amplifier circuit, and these circuit component elements and the conducting pattern are provided on the surface of the alumina substrate 1. The conducting pattern is formed of, for example, Cr or Cu by means of thin film forming technique such as sputtering, and is shown with hatching having a character P in FIG. 2.

The circuit structure of the frequency tuning type booster amplifier will be described briefly hereunder. The frequency tuning type booster amplifier is provided with the tuning circuit comprising inductance elements L2 and L3, capacitors C3 and C4, and the diode D1 and the amplifier circuit comprising the transistor Tr1, peripheral circuit elements (resistors R1 to R3, capacitor C6) , and a unbalance/balance conversion element T to select and amplify a TV signal of a desired frequency. The TV signal of a plurality of frequencies is supplied to the tuning circuit through the capacitor C1. The tuning frequency (resonance frequency) of the tuning circuit is variable by controlling a voltage (Vct1) applied on the cathode of the diode D1, only the desired TV signal is selected by adjusting the tuning frequency to the frequency of the desired TV signal, and the TV signal is supplied to the base of the transistor Tr1 of the amplifier circuit through the capacitor C5. Bias voltages are applied to base bias voltage dividing resistances R1 and R2 of the base of the transistor Tr1, and the collector current (emitter current) of the transistor Tr1 is set depending on the resistance value of the emitter resistance R3. The TV signal that has been amplified by means of the transistor Tr1 is sent out from the collector where the unbalance/balance conversion element T is provided. The unbalance/balance conversion element T has an inductance element comprising a pair of conducting paths S1 and S2 that are combined together. The balance TV signal is generated from both ends of the conducting path S2, and supplied to the above-mentioned UHF tuner.

As shown in FIG. 2, ground electrodes (GND) and input electrodes (Vcc, Vct1, and RFin) and output electrodes (RFout) are formed on the ends of the alumina substrate 1, the conducting pattern P is partially served as these electrodes. The ground electrodes, input electrodes, and output electrodes are formed only on two longer sides of the rectangular alumina substrate 1 that are facing each other and are not formed on the two shorter sides that are facing each other. In detail, GND electrodes are formed on both corners of one longer side of the alumina substrate 1, and a Vcc electrode, an RFin electrode, and a Vct1 electrode are formed between these GND electrodes. Three GND electrodes are formed on both corners of the other longer side of the alumina substrate 1 and near one corner, and two RFout electrodes are formed between these GND electrodes. As described hereinafter, the two longer sides of the alumina substrate 1 correspond to the parting line used when a large substrate is cut into divided rectangles, and the two shorter sides of the alumina substrate 1 correspond to the parting line used when a divided rectangle is further divided into small pieces.

On the other hand, as shown in FIG. 3, the conducting pattern P1 (backside electrode) formed on the back side of the alumina substrate 1 is facing to the ground electrodes (GND), input electrodes (Vcc, Vct1, and RFin), and output electrodes (RFout), and corresponding electrodes are rendered conductive through side end electrodes 3 as shown in FIG. 5 and FIG. 6. An end electrode 3 is formed by plating an Ni underplating layer and an Au layer successively on an Ag thick-film layer. The undermost thick film Ag layer has been formed by forming a thick film of Ag paste containing no glass composition and then by sintering it at a temperature of approximately 200° C. Therefore, the undermost thick film Ag layer is formed of low temperature sintered material. The Ni underplating layer laminated in-between is served for firm adhering of the Au plating layer, and the uppermost Au plating layer is served for preventing deposition of Ag of the undermost layer on solder when the end side electrode 3 is soldered to a soldering land of a mother substrate not shown in the drawing. In the completed product of the electronic circuit unit formed by mounting the shield cover 2 on the alumina substrate 1, legs 2a formed by bending the shield cover 2 on the side are soldered to the end side electrodes 3 that are conductive to the ground electrodes (GND), and the shield cover 2 is grounded at the four corners of the alumina substrate 1.

Each of the capacitors C1 to C7 among the above-mentioned circuit component elements is formed by laminating a top electrode on a bottom electrode with interposition of a film of dielectric material such as $SiO_2$, and these thin films are formed by means of sputtering. A Cu layer is formed on the surface of the top electrode and the Cu layer is effective to improve Q of the resonance circuit. The top electrode and the bottom electrode of each of the capacitors C1 to C7 is connected to the conducting pattern P, and discharging neighboring gaps (air gap) G are formed between the capacitor C7 and the Vcc electrode on the conducting pattern P, between the capacitor C7 and the RFout electrode on the conducting pattern P, and between the capacitor C2 and the Vct1 electrode on the conducting pattern P. Each of these neighboring gaps G is formed of a pair of projections provided on the parallel conducting patterns P facing each other, and the tips of both projections are facing each other with interposition of a certain gap. In this case, the dimensional precision of the conducting pattern P and the GND electrode is very high because of the thin film forming technique, the gap dimensional size of the neighboring gap G can be made very small, and discharging can occur at a low voltage. Among the capacitors C1 to C7, the capacitors C1 and C3 to C5 are formed simply rectangular, but the capacitors C2 and C7 are formed complexly non-rectangular with combination of two or more rectangles. In detail, the capacitor C2 has a convex shape having two rectangles projected from one side of another rectangle, and the capacitor C7 has a shape formed by three rectangles that are located continuously with a deviation in the longitudinal direction successively. These capacitors C2 and C7 are served as the ground capacitor for which a relatively large capacitance value is required, the ground capacitors C2 and C7 are formed complexly non-rectangular as described hereinabove because the limited space on the alumina substrate 1 is effectively used, and the capacitor of a desired capacitance value can be mounted in high density.

Furthermore, among the capacitors C1 to C7, the capacitor C6 comprises two ground capacitors having difference capacitance values, and the two capacitors are connected in parallel with interposition of a pair of conducting pattern P that are separated each other. In detail, as shown in FIG. 2, one electrode of each of both ground capacitors C6 is connected to the ground conducting pattern P connected to the GND electrode, and the other electrode of each of both ground capacitors C6 is connected to a connection land SL of the transistor Tr1 with interposition of the two conducting patterns P that are separated from each other. As it is obvious from FIG. 4, the capacitor C6 is located between the emitter of the transistor Tr1 and the ground, and the above-mentioned connection land SL is the portion where the emitter electrode of the transistor Tr1 is subjected to wire bonding. Therefore, the capacitance value of the capacitor C6 is set by two ground capacitors connected in parallel with interposition of the conducting patterns P that are separated from each other. As the result, the inductance of the whole conducting patterns P extending from the emitter electrode of the transistor Tr1 to the ground with interposition of the capacitor C6 is reduced, and the grounding effect of the connection land SL that is brought about by means of the ground capacitor C6 is improved. Furthermore, the parasitic oscillation frequency due to the ground capacitors C6 and conducting patterns P becomes higher. Therefore, the parasitic oscillation is prevented by setting the frequency to a value equal to or higher than the operating point frequency of the transistor Tr1.

The resistors R1 to R3 are resistance films formed of, for example, $TaSiO_2$ by means of thin film forming technique such as sputtering, and a film of dielectric material such as $SiO_2$ is formed on the surface of a resistor as required. As shown in FIG. 2, the resistors R1 and R2 among the three film resistors R1 to R3 are located adjacently in parallel to each other on the alumina substrate 1, and another film resistor R3 is located apart from the resistors R1 and R2. Because the film resistors R1 and R2 are formed adjacently, the ratio of the whole dispersion of the resistors R1 and R2 can be equalized even though the resistance value of the resistors R1 and R2 deviates from the desired value. As it is obvious from FIG. 4, the resistors R1 and R2 are served as the base bias voltage dividing resistor, a voltage of $R1/(R1+R2) \times Vcc$ is applied on the base of the transistor Tr1. Herein, because the ratio of the whole dispersion of the resistors R1 and R2 that are served as the base bias voltage dividing resistor is equal to each other always as described hereinabove, trimming of the resistance value of the resistors R1 and R2 is not required. On the other hand, the resistor R3 is the emitter resistance of the transistor Tr1, and a current flows from the Vcc electrode to the collector and emitter of the transistor Tr1 and is grounded through the resistor R3. Because the contribution of the resistor R3 to the amplification of the transistor Tr1 is largest among the resistors R1 to R3, only the resistor R3 is trimmed so that the current value is made constant for output adjustment.

Figure 9:
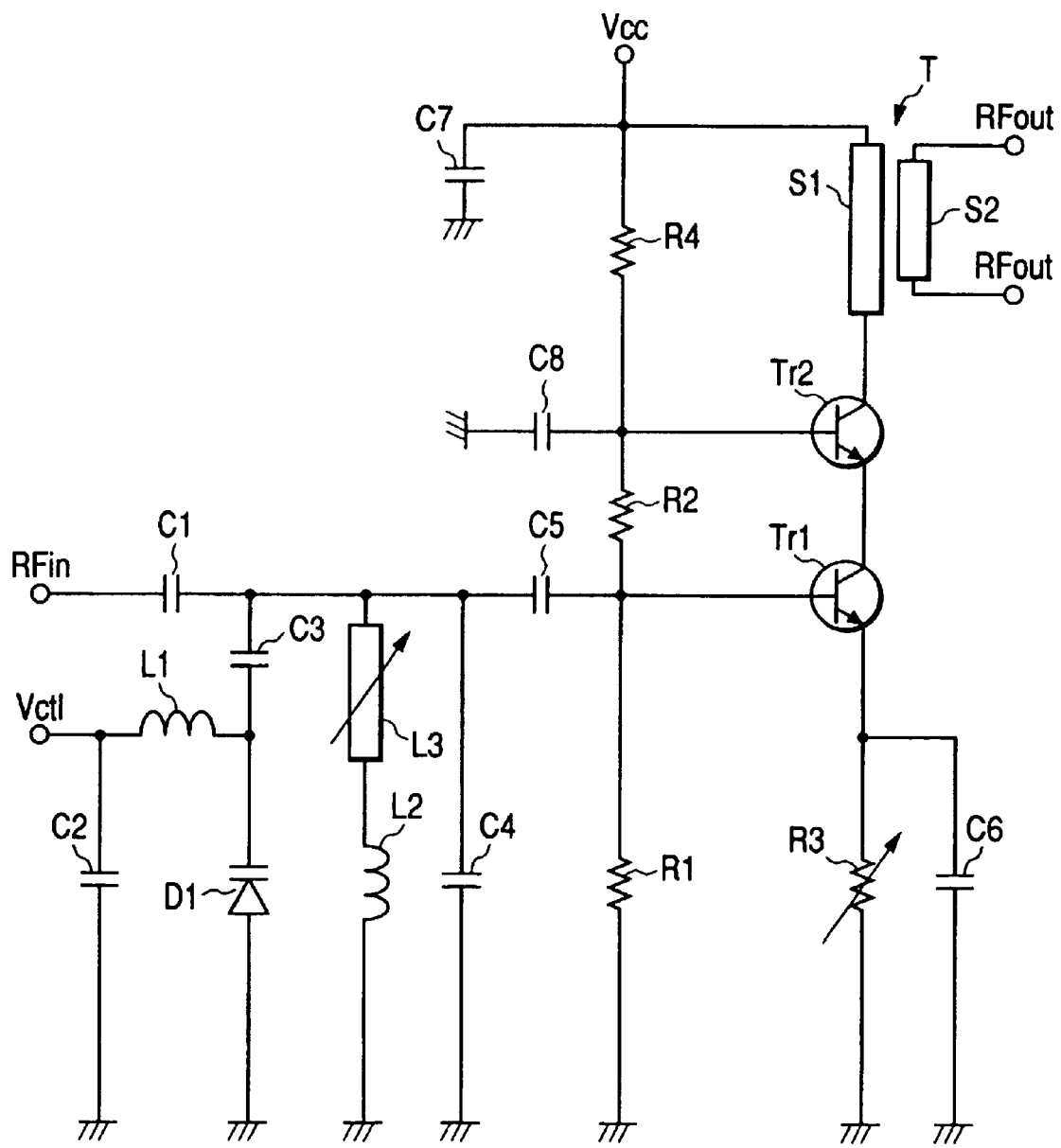
FIG. 9 is an explanatory view of another circuit structure.

As shown in FIG. 9, in the case of the circuit structure in which another transistor Tr2 is connected to the transistor Tr1 in series, the thin film resistors R1, R2, and R4 that are served as the base bias voltage dividing resistor of both transistors Tr1 and Tr2 are formed adjacently each other on the alumina substrate 1, as the result trimming of the resistance value of the resistors R1, R2, and R4 is not required. Therefore, also in this case, the current value of both transistors Tr1 and Tr2 can be set by trimming only the resistor R3 that is served as the emitter resistance.

Furthermore, the inductance elements L1 to L3 and the conducting paths S1 and S2 are formed of Cr or Cu by means of thin film forming technique such as sputtering, and connected to the conducting pattern P. A Cu layer is formed on each of the inductance elements L1 to L3, and the Cu layer is effective to increase Q of a resonance circuit. Each of the inductance elements L1 and L2 is formed rectangularly swirlingly, and one end of each of the inductance elements L1 and L2 is wire-bonded to the Vct1 electrode or ground conducting pattern P. The inductance element L2 is served to roughly set the resonance frequency, and the inductance element L3 is connected to the other end of the inductance element L2. The inductance element L3 is an adjusting conducting pattern served to adjust the resonance frequency. The inductance element L3 is trimmed as shown in FIG. 2 with a broken line to thereby increase the number of turns of the inductance element L2, and as the result the resonance frequency is adjusted. In this case, if the conductor width of the trimmed inductance element L3 is equalized to the conductor width of the inductance element L2 that is served for setting the resonance frequency, the characteristic impedance of the inductance element L2 is resultantly equalized to the characteristic impedance of the inductance element L3.

Figure 10:
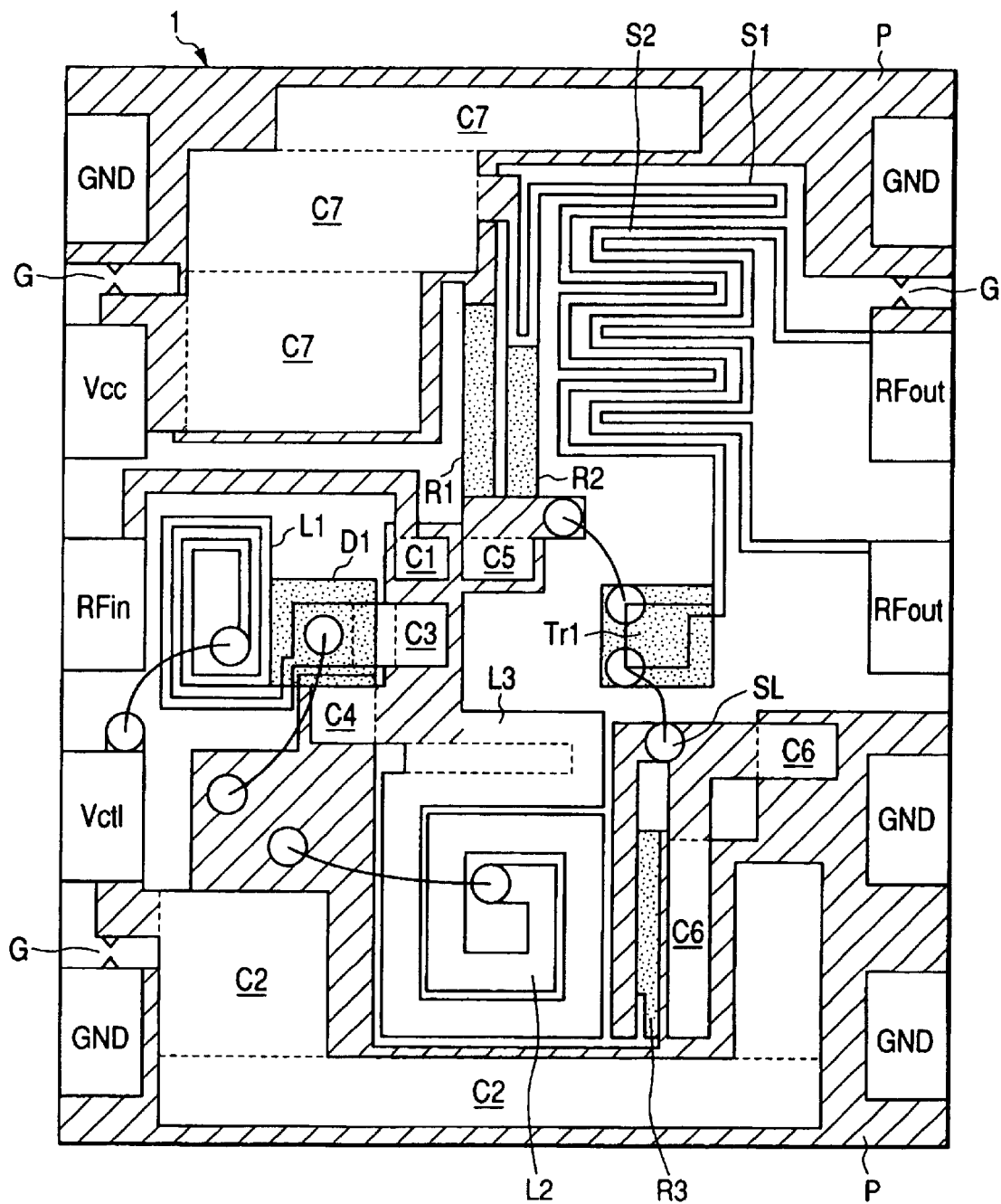
FIG. 10 is a plan view of an alumina substrate illustrating another circuit structure layout.

As described hereinbefore, the unbalance/balance conversion element T has the inductance element comprising the pair of conducting paths S1 and S2 combined each other, and these thin film conducting paths S1 and S2 are formed on the alumina substrate 1. These conducting paths S1 and S2 are formed swirlingly on the alumina substrate 1 facing each other with interposition of a predetermined gap, both ends of the one conducting path S1 are connected to the collector electrode of the transistor Tr1 and the conducting pattern P connected to the capacitor C7, and both ends of the other conducting path S2 are connected to a pair of RFout electrodes. In this case, because the dimensional precision of the thin film conducting paths S1 and S2 is high, the gap between both conducting paths S1 and S2 can be made narrow and the desired sufficient coupling can be secured resultantly, and the small unbalance/balance conversion element T is disposed on a limited space on the alumina substrate 1. As shown in FIG. 10, the pair of conducting paths S1 and S2 facing each other with interposition of the predetermined gap may be formed in zigzag fashion on the alumina substrate 1.

Furthermore, the diode D1 and transistor Tr1 are formed by means of a process in which a semiconductor bare chip is mounted on the connection land of the thin film conducting pattern P formed on the alumina substrate 1 and the semiconductor bare chip is connected to the conducting pattern P by means of wire bonding. In detail, as shown in FIG. 2, the semiconductor bare chip of the diode D1 is formed rectangular, the one electrode disposed on the bottom surface of the semiconductor bare chip is fixed to the connection land by use of conductive adhesive such as cream solder or conductive paste, and the other electrode disposed on the top surface of the semiconductor bare chip is connected to the predetermined position on the conducting pattern P by means of wire bonding. Furthermore, the semiconductor bare chip of the transistor Tr1 is formed also rectangular, the collector electrode disposed on the bottom surface of the semiconductor bare chip is fixed to the connection land by use of conductive adhesive, and the base electrode and the emitter electrode are connected to the predetermined position on the conducting pattern P by means of wire bonding. As in the case of the above-mentioned end side electrode 3, an Ni underplating layer and an Au plating layer are laminated successively on each of these connection lands. Herein, as shown in FIG. 7A and FIG. 7B, the connection land 5 is formed so that the area of the connection land 5 is smaller than the bottom surface area of the semiconductor bare chip 4, a space for retaining conductive adhesive is secured under the semiconductor bare chip 4 because of such a structure. As the result, the space does not allow conductive adhesive from spewing outside the semiconductor bare chip 4 to result in short-circuit to the surrounding conducting pattern P. Furthermore, an opening 5a is formed in the connection land 5 and excessive conducting adhesive is retained in the opening 5a. Therefore, spewing of conductive adhesive is prevented surely the more.

Next, the fabrication process of an electronic circuit unit structured as described hereinabove will be described mainly with reference to FIG. 8A to FIG. 8J.

At first, as shown in FIG. 8A, a $TaSiO_2$ film is formed on the entire surface of an alumina substrate 1 by means of sputtering and then etched in desired configuration to form a resistance film 6. Thereby, portions corresponding to the resistors R1 to R3 are formed. Next, as shown in FIG. 8B, Cr film or Cu film is formed on the resistance film 6 by means of sputtering and then etched in desired configuration to form the bottom electrode 7. A $SiO_2$ film is formed on the bottom electrode 7 by means of sputtering and then etched in desired configuration to form the dielectric film 8. Next, as shown in FIG. 8D, a Cr film or Cu film is formed on the dielectric film 8 by means of sputtering and then etched in desired configuration to form the top electrode 9. As the result, the area corresponding to the conducting pattern P, inductance elements L1 to L3, and conducting paths S1 and S2 is formed by the bottom electrode 7 or the top electrode 9, and the area corresponding to the capacitors C1 to C7 is formed by the laminate comprising the bottom electrode 7, dielectric film 8, and top electrode 9. Next, a Cu layer is formed on the surface of the area corresponding to the inductance elements L1 to L3, conducting paths S1 and S2, and capacitors C1 to C7 by means of plating or thin film forming technique, and a protecting film 10 is formed on the area excluding the area of the conducting pattern P as shown in FIG. 8E. Next, as shown in FIG. 8F, a Cr film or Cu film is formed on the entire back surface of the alumina substrate 1 by means of sputtering, and then etched in desired configuration to form the backside electrode 11. Thereby, the area corresponding to the backside conducting pattern P1 is formed.

Steps described with reference to FIG. 8A to FIG. 8F are carried out on a large substrate consisting of alumina material on which notch grooves extending in vertical direction and horizontal direction in lattice fashion are formed. On the other hand, steps described with reference to FIG. 8G to FIG. 8J are carried out on each divided rectangular piece obtained by cutting along notch grooves extending in one direction.

In detail, the large substrate is cut into divided rectangular pieces, then, as shown in FIG. 8G, thick film Ag layers 12 ace formed on both end sides of the alumina substrate 1, which are cut surfaces of the divided piece, and the ground electrodes (GND), input electrodes (Vcc, Vct1, and RFin), and output electrodes (RFout) of the conducting patterns P and P1 disposed on both front and back surface of the alumina substrate 1 are connected conductively with the Ag layers 12. The Ag layer 12 corresponds to the Ag thick-film layer of the end side electrode 3, which is formed of low temperature sintered material consisting of Ag paste including no glass composition. The thick film forming step for forming the Ag layer 12 can be carried out on one rectangular divided piece. However otherwise, the step may be carried out on a plurality of divided pieces that are stacked with interposition of a small space between adjacent pieces, and as the result the thick film Ag layer 12 is formed on a plurality of divided pieces simultaneously. This method is suitable for mass-production. Next, Ni under layer and Au layer are formed successively by means of plating on the Ag layer 12 and the surfaces of the connection lands where the semiconductor bare chip is to be mounted. Thereafter as shown in FIG. 8H, the semiconductor bare chip of the diode D1 and transistor Tr1 is fixed on the connection lands by use of conductive adhesive such as cream solder or conductive paste. In this case, because the area of the connection land is smaller than the bottom surface area of the semiconductor bare chip as described hereinabove, spewing of conductive adhesive from the semiconductor bare chip is prevented, and as the result undesired short-circuit between the conductive adhesive and the conducting pattern P that is surrounding the semiconductor bare chip is prevented. Next, as shown in FIG. 8I, each semiconductor bare chip is fixed to the predetermined position of the conducting pattern P by means of wire bonding. Thereafter as shown in FIG. 8J, the resistor R3 that is served as the emitter resistance is trimmed to adjust the output and the inductance element L3 that is served as the adjusting conducting pattern is trimmed to adjust the resonance frequency. In this case, adjusting of the resonance frequency is carried out on a rectangular divided piece that has not been divided into individual alumina substrate 1, and the ground electrodes are provided on corners of each alumina substrate 1. Therefore, ground electrodes (GND) are located always between input electrodes (Vcc, Vct1, and RFin) and output electrodes (RFout) located on adjacent alumina substrates 1, and as the result the adjustment of resonance frequency will not adversely affect the circuit of the adjacent alumina substrate 1.

Next, a shield cover 2 is fixed to each rectangular divided alumina substrate 1 and legs 2a of the shield cover 2 is soldered to the end side electrodes 3 that are connected to the ground electrodes (GND). Thereafter, the divided piece is cut along the dividing grooves extending in the other direction to form individual alumina substrates 1, and an electronic circuit as shown in FIG. 1 is thus obtained.

According to the electronic circuit unit in accordance with the above-mentioned embodiment having the structure as described hereinbefore, thin film circuit elements such as the capacitors C1 to C7, resistors R1 to R3, inductance elements L1 to L3, and conducting paths S1 and S2 and a thin film conducting pattern P that is connected to these circuit elements are formed on the alumina substrate 1, the semiconductor bare chip of the diode D1 and transistor Tr1 is fixed on the alumina substrate 1 by means of wire bonding, and end side electrodes 3 that is connected to ground electrodes and input/output electrodes of the conducting pattern are formed on the side surface of the alumina substrate. As the result, necessary circuit component elements can be mounted in high density on the alumina substrate 1 by means of thin film forming technique and wire bonding of semiconductor element, and the surface mounting type electronic circuit unit that is suitable for miniaturization is realized. Furthermore, only the emitter resistor R3, out of the base bias voltage dividing resistors R1 and R2 of the transistor Tr1 and the emitter resistor R3 of the transistor Tr1, is trimmed for output adjustment, and trimming of the base bias voltage dividing resistors R1 and R2 is omitted. As the result, the resistance value can be trimmed at one location for output adjustment.

The present invention is applied as described in the above-mentioned embodiment and exhibits the effect described hereunder.

The electronic circuit unit has the structure in which circuit elements including capacitors, resistors, and inductance elements are formed on the alumina substrate by means of thin film forming technique and the semiconductor bare chip of the transistor is wire-bonded so that only the emitter resistor out of the base bias voltage dividing resistors and the emitter resistor of the transistor is trimmed. As the result, circuit parts that are necessary to be mounted on the alumina substrate can be mounted in high density to miniaturize the electronic circuit unit. Furthermore, even if individual base bias voltage dividing resistors formed on the alumina substrate by means of thin film forming technique have some resistance value dispersion, because the collector current value of the transistor can be varied by trimming only the emitter resistor, trimming of the base bias voltage dividing resistors can be omitted.

The circuit elements including capacitors, resistors, and inductance elements are formed on the alumina substrate by means of thin film forming technique, the semiconductor bare chip of the transistor is wire-bonded, and the base bias voltage dividing resistors of the transistors are formed proximate each other by means of thin film forming technique. As the result, necessary circuit parts can be mounted in high density on the alumina substrate so that the electronic circuit unit is miniaturized. Furthermore, because the ratio of the dispersion of the whole voltage dividing resistance is almost equalized even if individual voltage dividing resistances has some deviation from the desired value, trimming of the resistance value of the base bias voltage dividing resistance of the transistor can be omitted, and the output adjustment is simplified.

What is claimed is:

1. An electronic circuit unit comprising thin film circuit elements including capacitors, resistors and inductance elements formed on an alumina substrate, and a semiconductor having a second transistor connected to a first transistor in series, the first transistor wire bonded to the alumina substrate, wherein only an emitter resistor, out of base bias voltage dividing resistors and the emitter resistor of the first transistor, is trimmed to set a current value of the first transistor.

2. The electronic circuit unit of claim 1, wherein the emitter resistor is formed more distal to the first transistor than the base bias voltage dividing resistors.

3. The electronic circuit unit of claim 1 wherein the resistors are formed in the same thin film forming technique.

4. An electronic circuit unit comprising circuit elements including thin film capacitors, resistors, and inductance elements formed on an alumina substrate, and a semiconductor having a second transistor connected to a first transistor in series, the first transistor wire bonded to the alumina substrate, wherein only an emitter resistor is trimmed to set a current value of the first transistor, wherein thin film base bias voltage dividing resistors to apply a voltage to a base of the first transistor are formed proximate to each other on the alumina substrate.

5. The electronic circuit unit according to claim 4, wherein at least a part of the base bias voltage dividing resistors are located on a plurality of lines in parallel.

6. The electronic circuit unit of claim 4, wherein the base bias voltage dividing resistors are formed more proximate to the first transistor than an emitter resistor of the first transistor.

7. The electronic circuit unit of claim 4, wherein the resistors are formed in the same thin film technique.

8. The electronic circuit unit of claim 4, wherein out of the base bias voltage dividing resistors and an emitter resistor of the first transistor, only the emitter resistor is trimmed to set a current value of the first transistor.

* * * * *

UNITED STATES PATENT AND TRADEMARK OFFICE
CERTIFICATE OF CORRECTION

PATENT NO.      : 6,714,420 B2
DATED           : March 30, 2004
INVENTOR(S)     : Akiyuki Yoshisato et al.

It is certified that error appears in the above-identified patent and that said Letters Patent is hereby corrected as shown below:

<u>Title page,</u>
Item [56], References Cited, FOREIGN PATENT DOCUMENTS, insert the following:
-- JP          Hei 8-265067        10/1996
   JP          Hei 8-335833        12/1996 --.

Signed and Sealed this

Thirtieth Day of November, 2004

JON W. DUDAS
*Director of the United States Patent and Trademark Office*